United States Patent [19]
Bauer et al.

[11] Patent Number: 5,822,256
[45] Date of Patent: Oct. 13, 1998

[54] METHOD AND CIRCUITRY FOR USAGE OF PARTIALLY FUNCTIONAL NONVOLATILE MEMORY

[75] Inventors: Mark E. Bauer, Cameron Park; Steven Wells, Citrus Heights; David M. Brown, Fair Oaks; Johnny Javanifard, Sacramento; Sherif Sweha, El Dorado Hills; Robert N. Hasbun, Shingle Springs; Gary J. Gallagher, Rancho Murieta; Mamun Rashid, Fairfield; Rodney R. Rozman, Placerville; Glen Hawk, Cameron Park; George Blanchard, Loomis; Mark Winston, El Dorado Hills; Richard D. Pashley, Roseville, all of Calif.

[73] Assignee: Intel Corporation, Santa Clara, Calif.

[21] Appl. No.: 811,194

[22] Filed: Mar. 5, 1997

Related U.S. Application Data

[63] Continuation of Ser. No. 301,119, Sep. 6, 1994, abandoned.

[51] Int. Cl.[6] .................................................. G11C 7/00
[52] U.S. Cl. ............... 365/200; 365/185.09; 365/185.11; 365/185.29; 365/218; 365/230.03
[58] Field of Search ............................... 365/200, 230.03, 365/218, 185.03, 185.09, 185.11, 185.29

[56] References Cited

U.S. PATENT DOCUMENTS

| | | | |
|---|---|---|---|
| 4,007,452 | 2/1977 | Hoff, Jr. ............................... | 340/173 R |
| 4,376,300 | 3/1983 | Tsang et al. ............................. | 365/200 |
| 5,012,425 | 4/1991 | Brown ................................ | 364/464.02 |
| 5,043,940 | 8/1991 | Harari ................................... | 365/168 |
| 5,163,021 | 11/1992 | Mehrotra et al. ........................ | 365/185 |
| 5,200,959 | 4/1993 | Gross et al. ........................... | 371/21.6 |
| 5,233,559 | 8/1993 | Brennan, Jr. ........................... | 365/200 |
| 5,295,101 | 3/1994 | Stephens, Jr. et al. .................. | 365/200 |
| 5,307,316 | 4/1994 | Takemae ................................ | 365/200 |
| 5,377,146 | 12/1994 | Reddy et al. ........................... | 365/200 |
| 5,377,147 | 12/1994 | Merchant et al. ....................... | 365/200 |
| 5,406,520 | 4/1995 | Tay ....................................... | 365/200 |
| 5,440,505 | 8/1995 | Frazio et al. .................. | 365/189.01 X |
| 5,515,317 | 5/1996 | Wells et al. .................... | 365/185.03 X |
| 5,524,231 | 6/1996 | Brown ................................. | 365/195 X |
| 5,602,771 | 2/1997 | Kajigaya et al. ........................ | 365/51 |

FOREIGN PATENT DOCUMENTS

| | | |
|---|---|---|
| 0392895 | 10/1990 | European Pat. Off. . |
| 2251324 | 7/1992 | United Kingdom . |

*Primary Examiner*—Do Hyun Yoo
*Attorney, Agent, or Firm*—Blakely, Sokoloff, Taylor & Zafman

[57] ABSTRACT

A method and circuitry are described that permit one to utilize a partially functional integrated circuit memory. A memory array is segregated into separate blocks that can each be isolated to minimize the amount of the memory array rendered unusable by a defect. Circuitry is also provided to program memory cells within the array to one of at least three amounts of charge and thereby increase the amount of storage provided by the remaining functional blocks.

52 Claims, 7 Drawing Sheets

METHOD AND CIRCUITRY FOR USAGE OF
PARTIALLY FUNCTIONAL NONVOLATILE
MEMORY

This is a continuation of application Ser. No. 08/301,119, filed Sep. 6, 1994, now abandoned.

FIELD OF THE INVENTION

The present invention relates to the design of integrated circuit memory devices. More particularly, the present invention relates to a method and circuitry for using partially functional integrated circuit memory.

BACKGROUND

Semiconductor memories use a variety of semiconductor memory cell designs. One type of nonvolatile memory cell uses an electrically isolated floating gate to trap charge. A variety of mechanisms can be used to insert charge into the floating gate and to pull charge from it. Electron tunneling can be used both to inject charge and to pull charge off the floating gate of a memory cell. Hot electron injection is another mechanism for inserting charge into a floating gate of a memory cell. Other nonvolatile semiconductor memories use a trapping dielectric to insert or remove charge from between the control gate of a memory cell and silicon.

British patent document no. GB 2 251 324 A, published Jul. 1, 1992, entitled *File Structure For a Nonvolatile Semiconductor Memory*, describes a computer system that uses a type of nonvolatile semiconductor memory known as flash memory. The patent document discloses various architectures to incorporate a flash memory into a computer system. One architecture referred to therein has a variable file structure wherein computer code is stored contiguously in flash memory, allowing a central processing unit (CPU) to execute computer code directly from the flash memory array without the need for random access memory (RAM). Another file structure disclosed has a sectored file structure wherein computer code is stored in sectors that are analogous to sectors on hard disk drives. On a hard disk drive, data is stored on concentric tracks, and each track is made up of sectors. Each sector is a grouping of data. Other details regarding the file structures, together with various alternatives, are also disclosed.

An attractive feature of nonvolatile semiconductor memories is their ability to retain data when power has been removed. Another attractive feature of nonvolatile semiconductor memories is their ability to store analog data. This permits storage of multiple bits of data in a single memory cell, which is sometimes called multistate storage. U.S. Pat. No. 5,043,940 discusses multistate storage wherein four states are defined in terms of the threshold voltage $V_t$ of a split-channel memory cell. Using these four states, one is able to store two bits of data per memory cell by applying multiple programming pulses to each memory cell. U.S. Pat. No. 5,163,021 describes multilevel programming of split-channel memory cells in greater detail. Multistate storage provides an ability to increase the density of a storage array by storing more than one bit per cell. Typically, it takes longer to access a multiple bit per cell array than to access a similar single bit per cell array. Thus, in applications where access speed is critical, single bit per cell arrays are used. On the other hand, in applications where access speed is less critical than array density, multiple bit per cell arrays are used. Typically different designs and circuitry are used to implement single bit per cell arrays than to implement multiple bit per cell arrays.

Regardless of whether a cell of a memory array can store a single bit or multiple bits, defects within the array can render it useless. Therefore, redundancy is typically built into the array. Redundancy permits one to provide full functionality from an array that has a small number of defects by using redundant portions of the array in place of those portions of the array that are defective. U.S. Pat. No. 5,233,559, for example, describes a redundancy scheme used to provide row redundancy in a nonvolatile memory array.

There are limits to the benefits of providing redundancy. Redundant circuits increase the complexity of a part and also occupy precious real estate within the integrated circuit chip. The more redundant circuits one provides, the more likely it becomes that the number of redundant circuits will exceed the number of defects. In such a case, there will be redundant circuits that are unused. Furthermore, the more redundant circuits one provides, the more likely it becomes that a defect will occur in the redundant circuitry. Moreover, no matter how much redundancy one provides to a circuit, if the number of defects is great, there will be insufficient redundancy to compensate for the defects and restore full functionality. Therefore, a significant number of dice are built that must be scrapped because they contain so many defects that they cannot be brought up to full functionality. The cost of producing these defective chips that must be scrapped is included into the cost of producing the fully functional ones.

Various strategies are known that can be used to compensate for memory arrays that cannot be brought up to full functionality. At the wafer level, U.S. Pat. No. 4,007,452 describes a wafer scale integration system and method for interconnecting a plurality of separate memories (or other circuits) on a wafer so as to electrically exclude defective memories and include operative memories. A single discretionary connection is associated with each of the separate memories and this connection is made (or broken) after a memory is tested. In addition to a bidirectional memory bus used for input/output data and addresses, the wafer includes a separate identity bus used to define the memory organization. The identity bus is interconnected by a plurality of incrementers, one associated with each memory. The signal on the identity bus is incremented by usable memories and this signal is compared to an address on the bi-directional memory bus to select memories in an organized manner. This approach permits one to use a wafer that contains several separate memory arrays even when one or more of the arrays is defective. If, however, a separate memory within the wafer is not fully functional, the operational portions of the partially functional separate memory cannot be used because the entire defective separate memory is disabled.

At the chip level, U.S. Pat. No. 4,376,300 describes a memory system that employs a plurality of partially functional "mostly good" memory chips. For one embodiment, a programmable read only memory (PROM) is programmed to recognize the addresses of the defective elements of the mostly good memory chips and to cause a redundant memory chip to be selected. For another embodiment, a content-addressable memory (CAM) is employed to provide a new address in response to the addresses of defective elements in the mostly good memories. Although partially functional memory chips can be used if they are mostly good, a small number of defects within a memory chip can render the chip mostly bad and therefore unusable.

SUMMARY AND OBJECTS OF THE INVENTION

An object of the present invention is to provide a method and circuitry for simplifying production of nonvolatile memory by supporting several different applications using a single integrated circuit wafer design.

Another object of the present invention is to provide a method and circuitry to flexibly meet demand for various applications of nonvolatile memory integrated circuitry by using a single design for all applications.

Another object of the present invention is to provide a method and circuitry for decreasing the amount of wastage associated with the production of nonvolatile memory integrated circuits caused by manufacturing defects within the circuits.

Another object of the present invention is to provide a method and circuitry to decrease the production cost per unit for nonvolatile memories by recovering partially functional units for use in sub-optimal applications rather than discarding them as scrap.

These and other objects of the invention are met by a method and circuitry for isolating irreparable areas of nonvolatile memory arrays so as to minimize the amount of the array lost by a given defect. A memory array is segregated into separate blocks that can each be isolated to minimize the amount of the memory array rendered unusable by a defect. Circuitry is also provided to program memory cells arrays within a partially functional array to one of at least three amounts of charge and thereby increase the amount of storage provided by the remaining functional blocks.

Other objects, features, and advantages of the present invention will be apparent from the accompanying drawings and the detailed description that follows.

BRIEF DESCRIPTION OF THE DRAWINGS

The present invention is illustrated by way of example and not limitation in the figures of the accompanying drawings in which like references indicate similar elements and in which.

DETAILED DESCRIPTION

Figure 1:
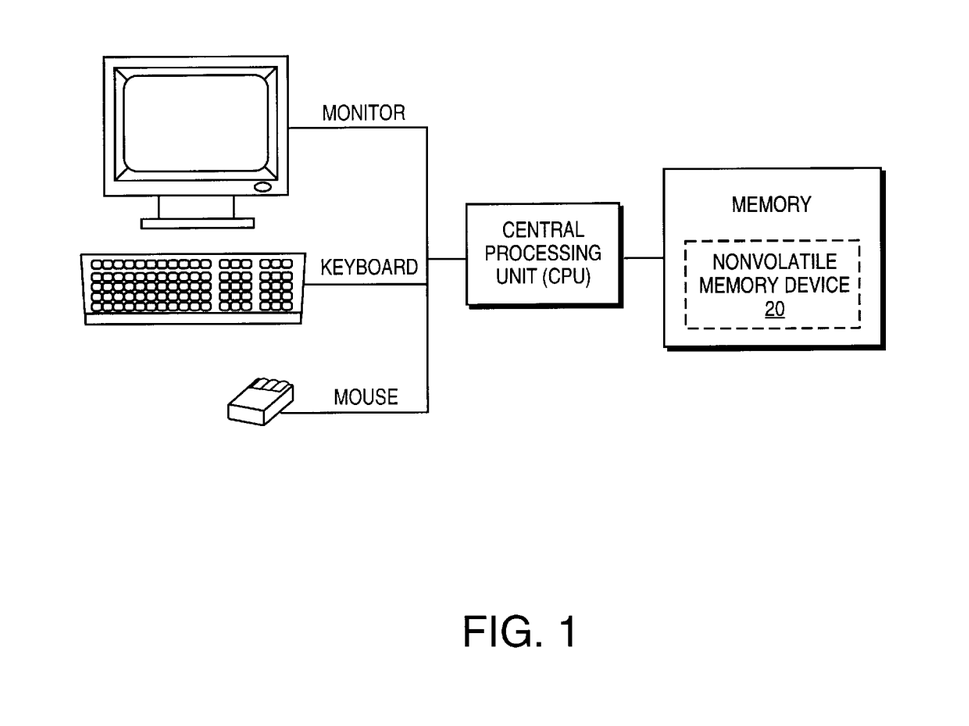
FIG. 1 is a block diagram of a personal computer.

FIG. 1 illustrates a computer system in block diagram form. The computer system includes a central processing unit (CPU) and a monitor for visually displaying information to a computer user. A keyboard allows the computer user to input data to the CPU. By moving a mouse the computer user is able to move a pointer displayed on the monitor. Memory stores data used by the CPU. Nonvolatile semiconductor memory device 20 is one type of memory accessed by the CPU. Nonvolatile semiconductor memory 20 has the advantage of retaining data when powered off. For one embodiment, memory 20 is a single integrated circuit. Alternately, memory 20 includes several integrated circuits.

Nonvolatile memory array 20 has at least one memory array. Each memory array is segmented into blocks that can be individually isolated if they contain defects that would impair their operation. For one embodiment the flash memory array is segmented into 512K bit erase blocks that can each be individually isolated. This permits one to use the remaining functional portions of the array of memory 20 if there is a defect within the isolated block that is so large that the array cannot be repaired to full functionality using redundancy schemes.

Redundancy schemes are limited in the amount of defects that they can repair. In a redundancy scheme extra (redundant) rows and columns are provided within a memory array. If there are defects in small areas of the array, redundancy permits a substitution of the redundant rows and columns in place of the defective ones. Thus, one can bypass the defective rows and columns and use the extra rows and columns to repair the block.

If the defect is too big, or if the defects are too numerous, the redundant circuitry will not be able to repair all of the defects to yield a fully functional memory. In the past, the resulting partially functional memory was frequently thrown away as unusable scrap.

Memory 20 has circuitry that permits one to use it even if it is only partially functional. For one embodiment, memory 20 includes circuitry to identify the bad memory regions that are preventing memory 20 from being fully functional. Alternately, memory 20 has circuitry that will permit a system using memory 20 to determine what part of the address space is not usable.

There are two different approaches that can be employed to achieve the broad goal of being able to use partially functional memory components. These approaches can be used individually or in combination with each other. One approach is to add extra circuitry to isolate defects within the memory and thereby contain and minimize the damage each defect causes. The second approach is to add extra multi-level cell circuitry to single bit cell memory arrays. This permits the flash memory requirements of application product lines that do not require the use of fully functional components to be supported by reclaiming the partially functional dice that result when producing the fully functional flash components.

Another way to view these approaches is that they provide a memory chip that has several different ways that it can be configured. This permits chips that have defect isolation and multi-level cell capability to be produced from one die at the same time that one produces chips with standard features that can be used for normal component applications. Thus, if a particular chip contains defects that cannot be repaired through redundancy, it can be configured to employ the defect isolation hardware and thereby provide a partially functional memory with a minimum amount of loss of functionality. The same chip can also be configured to store a single bit per cell or can be configured to have multi-level cells and thereby store multiple bits per cell.

Thus, as a wafer is tested, if a bad block is found that will prevent a memory array on the wafer from being used as a normal fully functional component, the die is not scrapped as was the previous practice. Instead, the die is reconfigured by turning on defect isolation circuitry to minimize the amount of memory lost by the defect. Additionally, the partially functional die can be further reconfigured by turning on the multi-level cell capability to multiply the cell density of whatever usable cells it has. This permits one, for example, to double whatever usable cell density is remaining in the partially functional memory. Thus, for example, if a 16 Megabit single bit per cell array chip has defects, the defect isolation circuitry may be able to isolate the defects and thereby provide a chip that has more than 15 Megabits of usable storage capacity. Then one can turn on the multi-cell capability and double the capacity to more than 30 Megabits. This will yield 30 Megabits of storage in the same area that it normally takes to store 15 Megabits. Previously, separate wafers would be produced that were dedicated specifically for the multi-level cell use. As with the single bit per cell case, any resulting partially functional multi-level cell dice would be scrapped.

The addition of defect isolation and multi-level cell circuitry enables one to produce a chip that can be used in many different ways. The chip can be used with or without the defect isolation capability as a single bit per cell array, or as a multi-bit per cell array. As the dice are manufactured, a certain number of the dice will be defect free, or will have such a low number of defects that they can be repaired using their redundant rows and columns. These fully functional dice are used in the top of the line products that require no perceivable defects. The other, normally unusable, dice are then reclaimed and used in different products, or in different ways, where they do not need quite all of their full operational capability. This is accomplished by using the defect isolation circuitry that designates and isolates defective areas to be avoided, and also by adding in the multi-bit (multi-level cell) capability to beef up the areas that are not defective.

Thus, because one can use partially functional integrated circuits in less demanding applications than those applications requiring fully functional components, one does not have to dedicate integrated circuit production for each of the various applications. Ultimately, this means an increase in yield because there are more bits of storage available to be sold on each wafer produced. The more usable bits that one has on a wafer, the cheaper the production price per bit.

An overhead of extra circuitry (i.e., the defect isolation and multi-level circuitry) is put into every chip. The cost of the extra circuitry is spread out over production of all of the resulting usable components and returns the benefit of permitting one to use what normally would be considered defective dice. Thus, for a small incremental production cost increase, one is able to reap a significant benefit in the reduction of the production cost per usable bit of storage capacity.

There is an established market for the fully functional version of the chip that does not use the defect isolation or multi-bit capability. An example of a use for a chip without defect would be to use the chip in any standard flash application. Alternately, one can add other features beyond those of a standard flash component to the chip that has the capability to operate while only partial functional. For example, a chip can be made with a Synchronous Flash Interface so that the chip will work with a synchronous CPU and permit direct execution out of flash memory (as opposed to having to go to RAM first). By putting many possible configurations into a single part, one is able to cover a much broader range of component applications.

To meet the demand for fully functional components, one must build the fully functional wafers for components. The provision of extra circuitry within these wafers permits one to take what would have been scrap silicon and use it in less demanding applications such as memory cards that can be fabricated using several partially functional memory chips. The price per memory card made using the partially functional chips then becomes simply the incremental cost associated with providing the extra circuitry plus the floor price for any other peripheral chips used in the memory cards. This, in effect, provides almost free memory to use to build less demanding products.

A partially functional memory array that has gaps within its memory address range caused by defects that cannot be fixed cannot be used as a standard flash component. For example, a partially functional 16 Megabit chip could have something less than 16 Megabits of usable storage even though its fully functional counterpart has the ability to address 16 Megabits. Therefore, the partially functional memory chip is not usable as a normal application component (e.g., it cannot be used as a BIOS (basic input/output system) chip in a computer because a BIOS chip cannot have "holes" in its address space). It is important, however, that there be a second use in which one can employ the partially functional and/or multi-level cell chips.

There are, however, several ad hoc uses of the partially functional and multi-level cell reclaimed chips that can be made in various products. For one embodiment, one can build a small memory subset system within the CPU to map out the non-functional regions of the partially functional memory array. This can be done, for example, in a solid state disk system. Partially functional memory chips can also be used in solid state disks and memory components that have some intelligence in them provided by peripheral support chips. In these components, either hardware, or software, or both, can manage memory that basically does not have use of all of its address space.

For another embodiment, partially functional components can be sold outright as such. There are some applications where customers are willing to accept memory components that may have only a fraction of the total memory that would be available if the entire die was functional, provided that the partially functional components are sold at a discount. For example, partially functional components can be sold at a discounted price for low reliability memory media applications, such as digital audio or graphics storage where one can tolerate a small number of bad bits. Thus, by reconfiguring a single component, one can segment the market for a single product line.

The provision of defect isolation and multi-level cell circuitry is a different approach than simply providing redundant circuitry. The defect isolation circuitry allows one to isolate defects at the erase block level.

On the other hand, a memory system that uses partially functional memory chips can be formed by adding one extra memory chip. For example, suppose one desires to build a system that could be formed by ten fully functional 16 Megabit chips. Instead of using ten fully functional chips, one can use ten partially functional chips, (e.g., some 15 Megabit chips, some 14 Megabit chips and some 13 Megabit chips). An extra (eleventh) memory chip would also be added to the memory system to supplement the partially functional chips and thereby correct for the fact that there is variable chip memory density within the memory system. One extra partially functional 16 Megabit chip, and appropriate circuitry to convert addresses of defective locations in the partially functional chips into corresponding addresses of good locations within the extra chip, can make the system work as though it was formed by ten chips, each having a fully functional component capability. An example of one approach to using partially functional memory integrated circuits within a memory card can be found in co-pending U.S. patent application Ser. No. 08/086,043, filed Jun. 30, 1993, now U.S. Pat. No. 5,524,231, Brown, entitled "Non-volatile Memory Card with Interactive Address Mapping".

Figure 2:
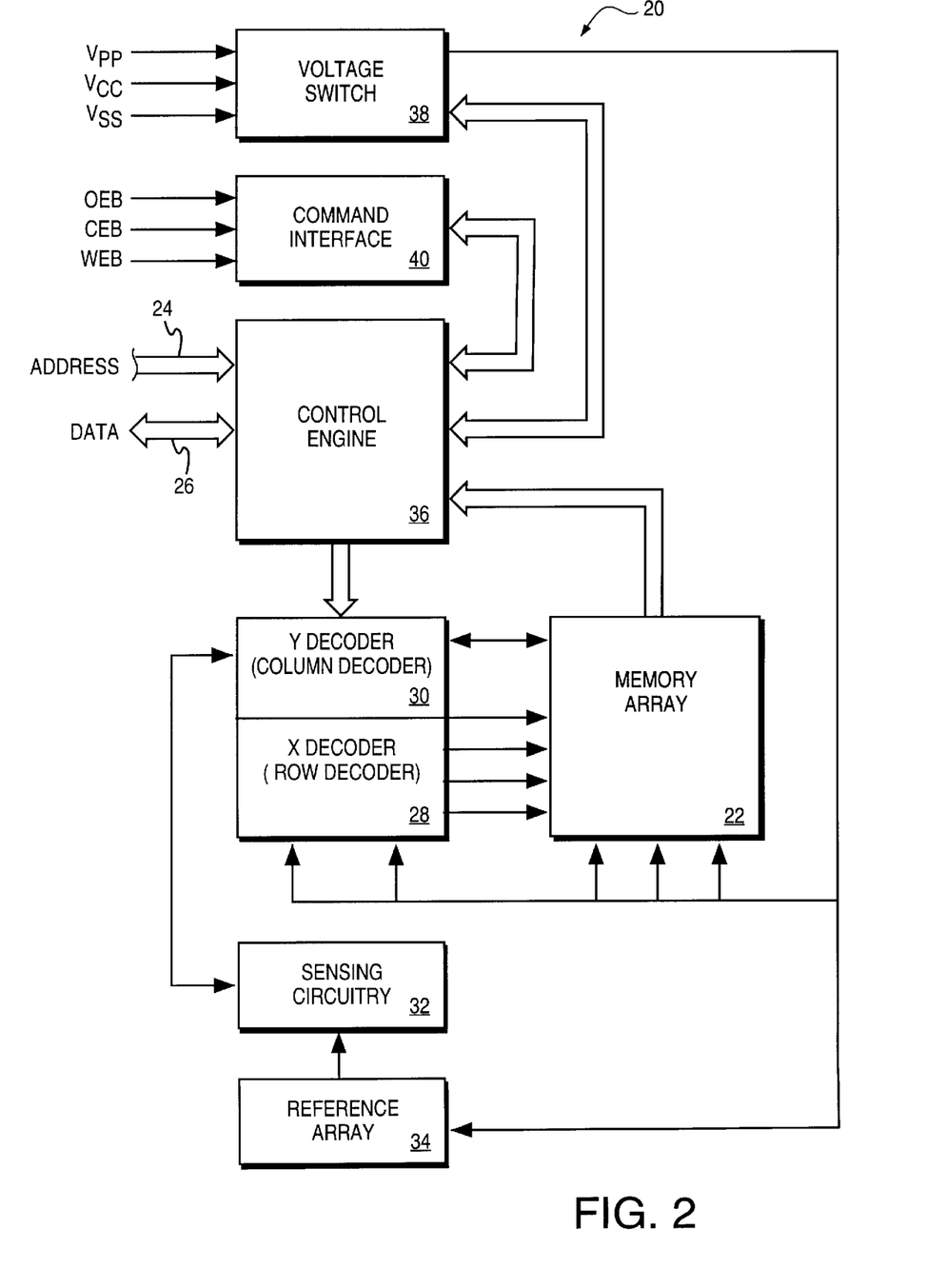
FIG. 2 is a block diagram of a memory device.

FIG. 2 illustrates in block diagram form nonvolatile memory device 20. For one embodiment, memory device 20 is fabricated on a single semiconductor substrate and stores data using nonvolatile memory cells within memory array 22. Device 20 can be configured so that threshold voltages of the nonvolatile memory cells can be altered during programming, thus permitting storage of analog voltage levels. Memory array 22 may include any type of memory cell with programmable threshold voltages, such as memory cells with trapping dielectrics or floating gates. For one embodiment, memory array 22 is comprised of flash memory cells.

Methods of programming memory cells to store discrete amounts of charge will be described in more detail herein below. Briefly described, these methods use multiple programming pulses to place differing discrete amounts of charge within the memory cells. The amount of charge placed within each memory cell is varied by varying the gate or wordline voltage level during programming pulses. Placing differing discrete amounts of charge in each memory cell permits storage of multiple bits of data in a single memory cell. These methods are applicable to both nonvolatile memory cells, such as used in flash EEPROMs (electrically erasable PROMs), and volatile memory cells, such as used in dynamic random access memories (DRAMs).

I. Memory Device Overview

The methods for utilization of partially functional memory devices can be applied to memory device 20. Vpp is the erase/program power supply for memory device 20. In the absence of a high voltage level on the memory cells, memory device 20 acts as a read only memory. The data stored at an address indicated by address lines 24 is read from memory array 22 and is output to the external user via data lines 26.

X decoder 28 selects the appropriate row within memory array 22 in response to address signals applied to address lines 24. For this reason, X decoder 28 is also called row decoder 28. Similarly, Y decoder 30 selects the appropriate column within memory array 22 in response to address signals from address lines 24. Because of its function, Y decoder 30 is also called column decoder 30.

Data output from memory array 22 is coupled to Y decoder 30. In turn, Y decoder 30, provides the data to sensing circuitry 32. Sensing circuitry 32 determines the state of data presented to it using reference cell array 34. Sensing circuitry 32 then passes the results of its analysis back to Y decoder 30.

For an embodiment of memory device 20, control engine 36 controls the erasure and programming of memory array 22. Control engine 36 also controls the programming of multilevel cells, which will be described in detail herein below. For one embodiment, control engine 36 includes a processor, that is controlled by microcode stored in on-chip memory. The particular implementation of control engine 36, however, does not affect the present method of utilizing partially functional integrated circuit memory.

Control engine 36 manages memory array 22 via control of row decoder 28, column decoder 30, sensing circuitry 32, reference cell array 34 and voltage switch 38. Voltage switch 38 controls the various voltage levels necessary to read, program and erase memory array 22. $V_{CC}$ is the device power supply and $V_{SS}$ is ground. $V_{PP}$ is the program/erase voltage, which must be high in order to program or erase data stored within memory array 22. $V_{PP}$ may be externally supplied or internally generated.

User commands for reading, erasure, and programming are communicated to control engine 36 via command interface 40. The external user issues commands to command interface 40 via three control pins: output enable OEB, write enable WEB, and chip enable CEB.

Figure 3:
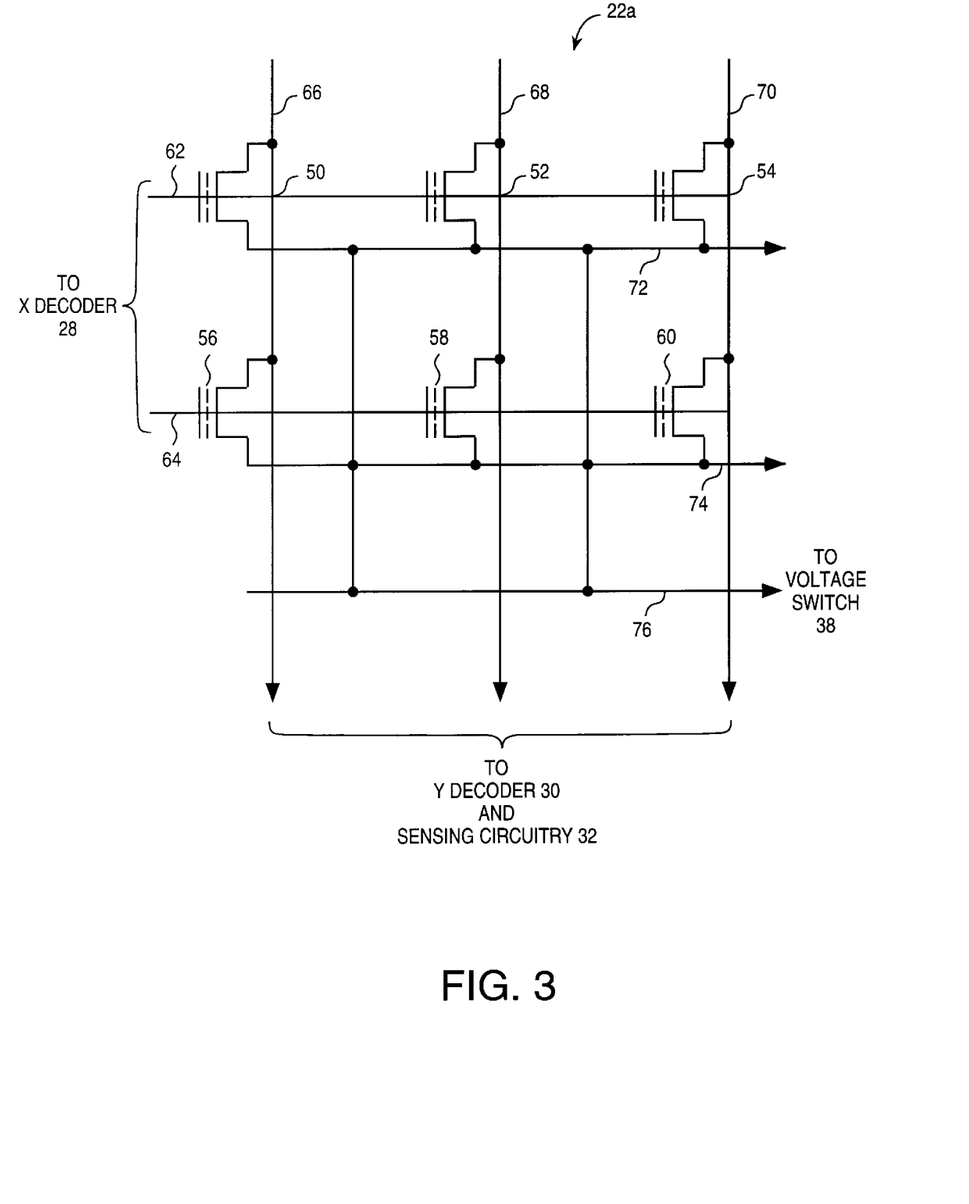
FIG. 3 is a schematic diagram of a portion of a memory array.

Utilizing partially functional integrated circuit memory according to the present methods requires some understanding of the organization of memory array 22. FIG. 3 illustrates in detail a portion 22a of memory array 22. Portion 22a includes six single field effect transistor floating gate memory cells 50, 52, 54, 56, 58, and 60. This type of memory cell is shown solely for illustration purposes. Other types of memory cells may also be programmed to multiple states. For example, multiple transistor memory cells and memory cells that use a trapping dielectric to shift the threshold voltage of the memory cells can both be programmed to multiple states Additionally, volatile memory cells, such as those used in DRAMs, can be programmed to multiple states.

Memory cells 50, 52, 54, 56, 58, and 60 are formed at the intersections of word lines 62 and 64 and bit lines 66, 68, and 70. Word lines 62 and 64 are also referred to as X lines or row lines. This is because each wordline is coupled to X decoder 28. Each wordline is also coupled to all memory cell gates in a particular row. For example, word line 62 is coupled to the gates of memory cells 50, 52, and 54. Bit lines 66, 68 and 70 are also referred to as Y lines or column lines because they are coupled to Y decoder 30. Each bitline is coupled to all memory cell drains in a particular column. For example, bitline 68 is coupled to the drains of memory cells 52 and 58. The sources of all memory cells in a row are coupled to a local source line. The sources of memory cells 50, 52 and 54 are coupled to local source line 72, while the sources of memory cells 56, 58 and 60 are coupled to local source line 74. Local source lines 72 and 74 are also coupled to common source line 76, which is coupled to voltage switch 38. Common source line 76 thus provides a mechanism for applying voltages to the sources of all memory cells within a block of memory array 22.

Together the bitlines, wordlines, and the common source line provide a means of applying to the memory cells the voltages necessary for programming, erasing, and reading memory cells within array 22. Memory cells 50, 52, 54, 56, 58 and 60 are erased via Fowler-Nordheim tunneling by applying approximately zero volts to memory cell gates via wordlines 62 and 64, allowing bitlines 66, 68 and 70 to float, and tying memory cell sources to approximately 12 volts via common source line 76. Memory cells 50, 52, 54, 56, 58, and 60 can also be erased via negative gate erase by applying −10 volts to memory cell gates, allowing the drains to float, and coupling the sources to 5 volts. Within flash memory arrays, an entire block of memory cells is erased at once. Memory cells are read, that is to say their states are sensed, by applying one to seven volts to wordlines 62 and 64, approximately one volt to bitlines 66, 68 and 70 and grounding common source line 76. Memory cells 50, 52, 54, 56, 58, and 60 are programmed via hot electron injection by applying a source voltage $V_S$ to common source line 76, applying a drain voltage $V_D$ to bitlines 66, 68, and 70 such that the bitline voltage level is 5 to 7 volts above source line 76; i.e., setting $V_{DS}$ to 5 to 7 volts, and applying a voltage level to wordlines 62 and 64 sufficient to change the amount of charge stored by the memory cells being programmed. Other voltage levels also can be used to program memory cells. As used herein, "programming pulse" refers to the combination of voltages applied to the bitline, sourceline, and wordline of a memory cell to shift its threshold voltage by changing the amount of charge stored in the memory cell.

A group of memory cells are selected for programming and reading by coordinating the control of wordline and bitline voltages. To illustrate, assume that memory cell 50 is to be programmed. The gate voltage for memory cell 50 is brought to, and held at, the appropriate level via wordline 62. The same voltage is also applied to the gate of memory cells 52 and 54. Local source line 72 applies the same voltage to the sources of all three memory cells. Memory cell 50 is programmed by pulsing the voltage on its drain by pulsing the voltage on bitline 66, while bitlines 68 and 70 are held near ground and wordline 62 is held at a high enough voltage to develop a desired electric field across the gate oxide of memory cell 50. Thus, only memory cell 50 is programmed. The duration of a programming pulse within memory array 22 is controlled by the duration of the high voltage on the selected bitline, that is to say, by the drain voltage.

As stated previously, programming and erasure of a memory cell alters its threshold voltage and the drain current conducted by the memory cell during sensing. Possible threshold voltages in a nonvolatile memory cell range from a lower limit of approximately 1.5 volts to an upper limit of approximately 7.0 volts. The lower limit of the programming range, or programming window, is constrained by erase times and gate disturb voltages. The upper level of the programming window is constrained by drain disturb voltages and bake charge loss. The programming window permits nonvolatile memory cells to store more than one bit of data.

For memory cells storing more than one bit of data there is not a one to one correspondence between the number of memory cells within array 22 and the number of bits of data stored by array 22. Thus, the phrases "memory cell" and "bit" are not used synonymously herein. "Memory cell" refers to a physical device, such as a transistor illustrated in FIG. 3, and "bit" or "bits" refers to the logical data stored within a memory cell.

In general, the number of bits, B, stored within a nonvolatile memory cell is related to the number of states, S, by the equation $S=2^B$, where B is not restricted to integer values. The number of states that could be stored within a nonvolatile memory cell is limited in practice by the ability to place states and to distinguish between those states at some later time. Thus, if the sensing circuitry can detect the difference of a single electron, then states may be defined in terms of a single electron. States may be defined in terms of memory cell threshold voltage level or drain current. Memory cell threshold voltage $V_t$, and drain current $I_D$ are approximately related to each other by the expression:

$I_D$ a $G_m \times (V_G - V_t)$ for $V_D > V_G - V_t$ $G_m$ is the transconductance of the memory cell;

$V_G$ is the memory cell gate voltage;

$V_D$ is the memory cell drain voltage; and $V_t$ is the memory cell threshold voltage.

For memory cells storing multiple bits of data, each of the possible patterns of bits represents one state. In effect, the cell is storing base S data, where S is the number of states the cell is capable of storing. The bit pattern results from decoding the state data of one or multiple cells. For example, for memory cells storing two bits of data there are four bit patterns: 00, 01, 10, and 11. Each of these bit patterns is represented by a state. The particular state represented by a particular pattern of bits depends upon the type of coding used. Two commonly used types of coding are Gray coding and binary coding. The type of coding used does not affect the method of programming.

States may be defined in a variety of ways. They may be defined in terms of a range of threshold voltages $V_t$, a range of drain currents $I_d$, or a range of charge.

As mentioned previously, the memory device can be configured so that threshold voltages of the nonvolatile memory cells can be altered during programming, thus permitting storage of analog voltage levels. A flash memory with a dual state mode and a multi-state mode provides an ability to use the fully functional chips as single bit per cell high speed random access components and the partially functional chips as multi-level cell high density storage. An example of one approach to providing a memory with a dual state mode and a multi-state mode can be found in co-pending U.S. patent application Ser. No. 08/252,686, filed Jun. 2, 1994, now abandoned, Bauer et al., entitled "A Dynamic Single Bit per Cell to Multiple Bit per Cell Memory".

The multi-level cell capability is not normally used to increase the density of the fully functional flash memories because the single bit per cell mode is significantly faster than the multi-level cell mode. Thus, a fully functional part can be used as a high speed component if the single bit per cell mode is used. The multi-level cell is applicable more for slower bulk memory storage applications. Multi-level cell requires error correction to be embedded into the system. Furthermore, there are things that one must do to the system outside of the multi-level cell chip to make it a usable piece of memory. Multi-level cell requires different tighter, specifications for power supplies, for example. Providing the system environment required to support multi-level cells would be cumbersome for the environments of the standard applications.

Any chips that are fully functional, can be sold at a premium as fast access single bit per cell memory. Any chips that are only partially functional can have their mode reconfigured so that one can extract as much memory from within the same silicon area as possible. Thus, the fully functional flash memories can be used in a single bit per cell mode to support high speed random access memory applications. The partially functional flash memories from the same wafer can be used in the multi-level cell mode to increase their storage capacity.

Chips are no longer simply good or bad but instead are fully functional, partially functional or scrap. One has the ability to use single bit cells in fully functional chips and to switch on multi-level cell capability for partially functional chips. Thus, one can reclaim what would formerly be the bad silicon on a wafer to build systems using the partially functional components, with the good silicon going out at a premium price as components.

This ability to use partially functional chips is enhanced by placing defect isolation circuitry into a chip to maximize the functionality of partially functional chips. The defect isolation circuitry is not just added to the memory array, but is also added to all of the pitch limited cells around the array.

Pitch is the width and the height of a cell. High memory array densities are achieved by using very small cells within the memory. The cells also need a row driver, however, to drive across the row and, unless each row driver is as small as the cells, the density of the memory array will be lowered. Ideally one should build each row driver within the height of a cell. A memory cell, for example, can be about 2 microns high. Therefore it is desirable to build a row driver that is also about 2 microns high. Under the current technology, however, a row driver cannot be built within the area of a cell because the cell is so small. Therefore, the row drivers are instead spread out. At the same time, the design rules are pushed specially for the pitch limited cells such as the row drivers so that the pitch limited cells are packed as densely as possible. Therefore, after the memory array, the pitch limited cells are the second most likely place on the chip to be susceptible to defect.

There are many different ways that one can organize an array architecture in flash memory. For example, for one prior art 16 Megabit (2 Megabyte) flash memory chip there are eight 2 Megabyte array planes. Every cell is addressed through a row and a column. Each column has a unique column select device across the whole array. The rows are all shared, so there is a decoder that drives out across the whole 2 Megabyte array. All 2K cells (512K by 4) across the row share a single row. The 2 Megabyte array is segmented into 512K bit erase blocks. Thus, if one desires to erase part of the memory, the minimum amount that can be erased in a single erase operation is 512K bits.

In this example prior art flash memory chip, each row is shared among four erase blocks and there is a single row driver for each row. The row driver has an inverter circuit with a power supply and a ground. The row drivers are built in a very dense area because the memory cells are so small. If one has a defect that will cause problems with a row driver (e.g., a short of the power supply to the row, or a short of the power supply to the ground) the problem can disable a large part of the array.

Thus, if one has a defective row driver, one can disable the half of the decoder associated with the defective row driver and then not use any of the array associated with the defect. To turn off all of the array associated with the defective pitch limited cell, however, would disable four erase blocks. This approach is not very effective because it renders a large portion of the memory unusable.

At a minimum, one will lose at least one row of four blocks. It may be possible to use a redundant row to replace the lost row. In the case where there is a common power supply for all of the row drivers of a decoder, a short between the supply and a single row will prevent one from using any of the drivers of the common supply. One need not necessarily disable multiple erase blocks because of one defective row driver, but if there are problems with the common power supply, or if there are shorts between the supply and a row, then the whole decoder with the common supply will be unusable.

Figure 4:
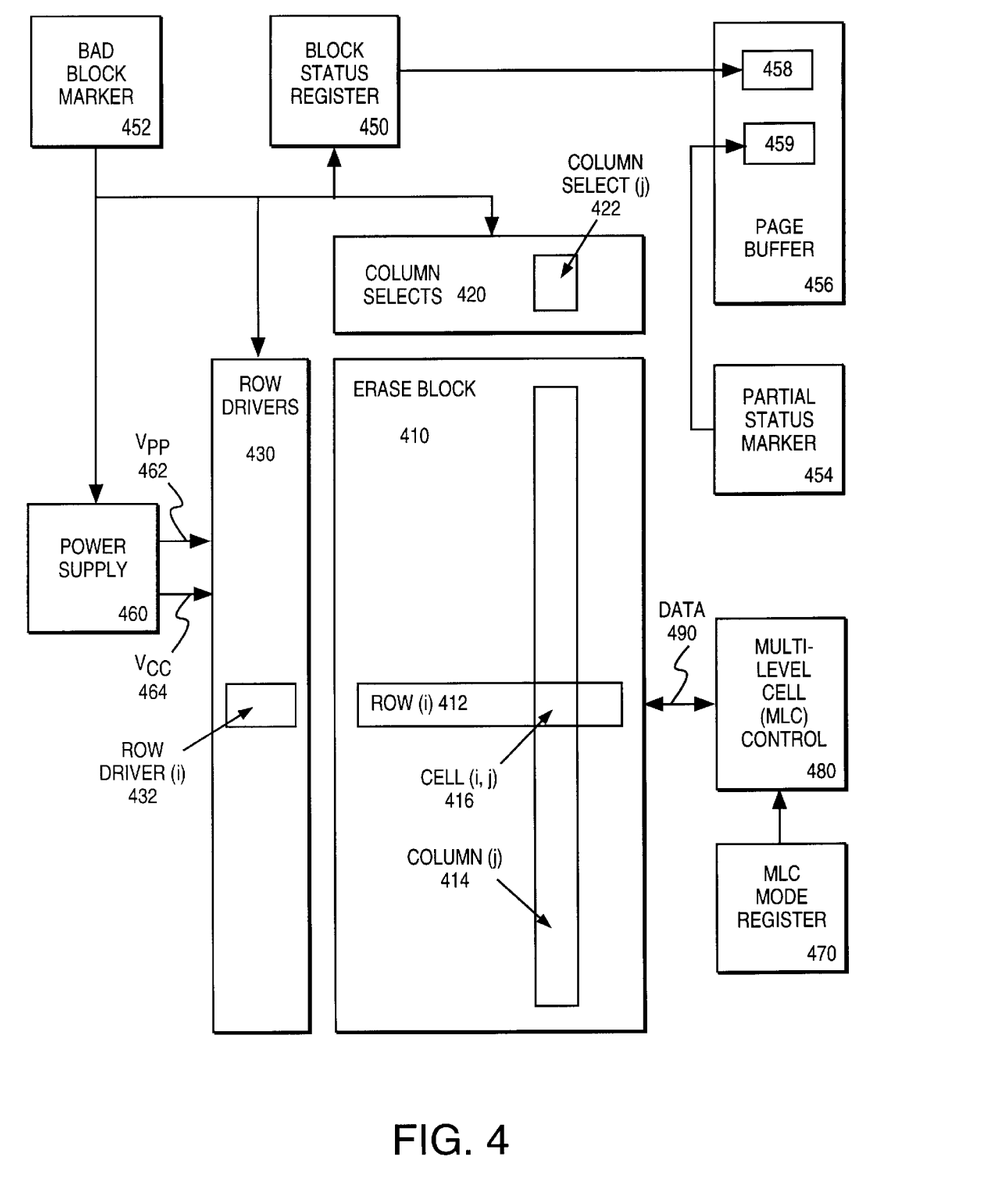
FIG. 4 is a block diagram of an erase block and its peripheral support circuitry.

FIG. 4 is a block diagram of an erase block and its peripheral support circuitry. In the figure, memory cells are arranged into rows and columns to form erase block 410. Thus, cell (ij) 416 is located within erase block 410 at the intersection of row (i) 412 and column (j) 414. Power supply 460 provides power to erase block 410. Vcc 464 is the normal operational voltage of erase block 410. Vpp 462 is used to program (erase) erase block 410.

Erase block 410 has separate sets of column selects 420 and row drivers 430 dedicated to the block. Thus, column select (j) 422 is used to select column (j) 414 and row driver (i) 432 is used for row (i) 412. Furthermore, bad block marker 452 is set to indicate to block status register 450 whether or not erase block 410 contains a defect rendering erase block 410 unusable (i.e., block status register 450 indicates the status of erase block 410). Bad block marker 452, in turn, is coupled to power supply 460, row drivers 430 and column selects 420. If bad block marker 452 indicates that erase block 410 contains a defect rendering erase block 410 unusable, then power supply 460, row drivers 430 and column selects 420 are disabled thereby effectively isolating the effects of the defect to within erase block 410.

If bad block marker 452 indicates that erase block 410 does not contain a defect rendering erase block 410 unusable, then power supply 460, row drivers 430 and column selects 420 are enabled and erase block 410 can be used.

For one embodiment, bad block marker 452 is a content addressable memory cell that is nonvolatile. An upload status user command can be issued in the same manner as one would issue a write or erase command. When the upload status command is issued, the contents of block status register 450 is loaded into a predetermined location (458) within page buffer 456. The user can then read location 458 within page buffer 456 to determine whether or not erase block 410 has been disabled. In a similar manner, the upload status command also causes the contents of the block status registers of the other erase blocks to be loaded into page buffer 456 so that they can be read by the user. Thus, for the example architecture wherein there are 32 erase blocks, the upload status command would cause 32 different predetermined bits within page buffer 456 to be set so that the status of each of the 32 erase blocks can be determined. By inspecting each of these 32 bits in page buffer 456, one can determine whether or not the memory is fully functional.

Alternately, another nonvolatile content addressable memory cell, partial status marker 454, is set to indicate whether or not the memory array is fully functional. Then, in addition to filling the 32 bits in page buffer 456 with the status of each block, the upload status command also loads predetermined location 459 of page buffer 456 with the contents of partial status marker 454. Thus, one can determine whether or not the memory device is fully functional simply by examining the single bit stored within location 459 of page buffer 456 after issuing the upload status command. If location 459 indicates that the memory array is not fully functional, one can then examine the status of each block to determine which blocks have been disabled.

Data 490 is stored into, and read from, erase block 410 through multi-level cell (MLC) control circuitry 480. MLC mode register 470 is coupled to MLC control circuitry 480. Depending upon the MLC mode value stored within MLC mode register 470, each cell of erase block 410 will either store a single bit or will store multiple bits. For one embodiment, there is a separate MLC mode register for each erase block within the memory array and the MLC mode for erase blocks can be varied on a block by block basis. Alternately, MLC mode register 470 is a global register and it controls all erase blocks so that each erase block has the same MLC mode.

The defect isolation circuitry for salvaging partially functional memories of FIG. 4 permits one to go in and, not only disable an entire erase block that has a defect, but also to disable its associated pitch limited cells. For the example architecture where there are eight 2 Megabit array planes, there will still be four sets of erase blocks per row, but rather than sharing row drivers among the blocks, there is a separate set of row drivers dedicated to each particular erase block. Thus, each erase block has its own set of row drivers and its own power supply switch. The power supply is basically a switch which either switches in read voltage, programming voltage or shuts the erase block off. Then, if there are defects inside the row drivers for an erase block, one can not only disable the row drivers for the erase block, but one can also disable the local power supply for the erase block. Therefore, one can still use the rest of the chip. In contrast to the prior art, the defect isolation circuitry permits one to localize the effect of a defect so that only a small amount of functionality is lost as a result of the defect. In the prior art, there would probably be a single power supply for two sets of row drivers, meaning that a single defective power supply would disable a fourth of the memory.

Thus, one part of the defect isolation is that row drivers are distributed locally, that a part of the decoding is performed locally and that each erase block has a separate local power supply. Similarly, another part of the defect isolation is that, for each set of column select devices, there is a set of column select drivers. The defect isolation circuitry permits one to disable these column select drivers also. In the case of columns, a defect can cause a short between a column select gain and the column or a defect can cause a feed back to a power supply thereby disabling a large portion of the chip.

The defect isolation circuitry permits one to disable the column selects, the row drivers and the power supply for each individual erase block. This permits one to isolate defects in the actual memory area of the chip to within the single erase block that contains the defect. Thus, a single defect can cause a loss of no more than one erase block. A marker bit is then employed to identify a disabled erase block as being a bad erase block. The marker bit drives control signals that disable all of the pitch limited cells around the disabled erase block.

There are various ways to actually get the information regarding disabled erase blocks out to the system. One way is to use a block status register within the chip that can be read by the system. The block status register indicates whether each individual erase block is usable or not. The block status register may also contain other information about the status of each erase block. For example, if an erase block is usable, the block status register could also indicate whether the block contains valid data or has been erased.

Alternately, some flash memory chips have an onboard microcontroller that can be used to determine what blocks (if any) are to be disabled because they contain irreparable defects. For this type of flash memory chip, the system can determine block status by causing the microcontroller of the chip to execute a program that is embedded into the firmware of the chip. The program can poll all of the marker bits of the chip and identify the bad erase blocks (e.g., blocks 1, 5 and 7) to the system. The system can then use a mechanism such as a look-up table to handle the holes in the address map caused by the disabled defective erase blocks. For one embodiment, the program is only run once, when the part is manufactured. Alternately, the program is run every time there is a power up of the chip.

The defect isolation circuitry on the chip can be used to ensure that any of the dense circuitry on the chip that is most sensitive to defects can be powered down. This permits one to ensure that defects can be isolated to small regions within the chip and do not impair the operation of the rest of the chip. Thus, the defect isolation circuitry provides a capability beyond the simple ability to mark erase blocks containing defects an being bad. The defect isolation circuitry provides the ability to limit the amount of functionality lost as a result of each defect.

Rather than sharing row drivers among erase blocks, as was done in the prior art, a separate set of row drivers is provided for each erase block. The row drivers are physically located between the blocks. A unique set of row drivers for each erase block are drawn inside of the pitch of the small flash cells of the erase block array. Marker bits are used to control powering down the drivers and power supply of each erase block that contains an irreparable defect.

Fundamentally, if one includes a set of unique row drivers for each erase block instead of sharing a set of row drivers among four blocks, one must include four times the number of device drivers for each array. That means that each chip has more devices than are required by a fully functional chip. Previously, the desire was to share as much of the array as possible across each peripheral support row and column decoder in order to keep the cost of the unit down. Adding additional devices increases the cost to build the chip.

If, however, one counter intuitively increases the device count by adding extra circuitry, one actually gains a benefit. This benefit is realized because, even though each part costs a little more to build, one is able to make use of far more dice than previously was the case. Partially functional dice that would otherwise have been discarded can be salvaged and used in less demanding applications that do not require fully functional devices. Thus, a small incremental increase in production cost provides a substantial gain in usable dice. One can increase the overall yield of usable dice by paying the extra cost associated with adding the defect isolation circuitry required to minimize loss of functionality caused by a defect by isolating defective erase blocks.

In every instance, one must provide row and column decoders to an array. The question then becomes what size is the optimum amount of the array to spread these support devices among. In the prior art, two defective decoders could wipe out a quarter of the available memory. When circuitry is provided to isolate defects to single erase blocks, two defects at most will only wipe out an eighth of the available memory.

Figure 5:
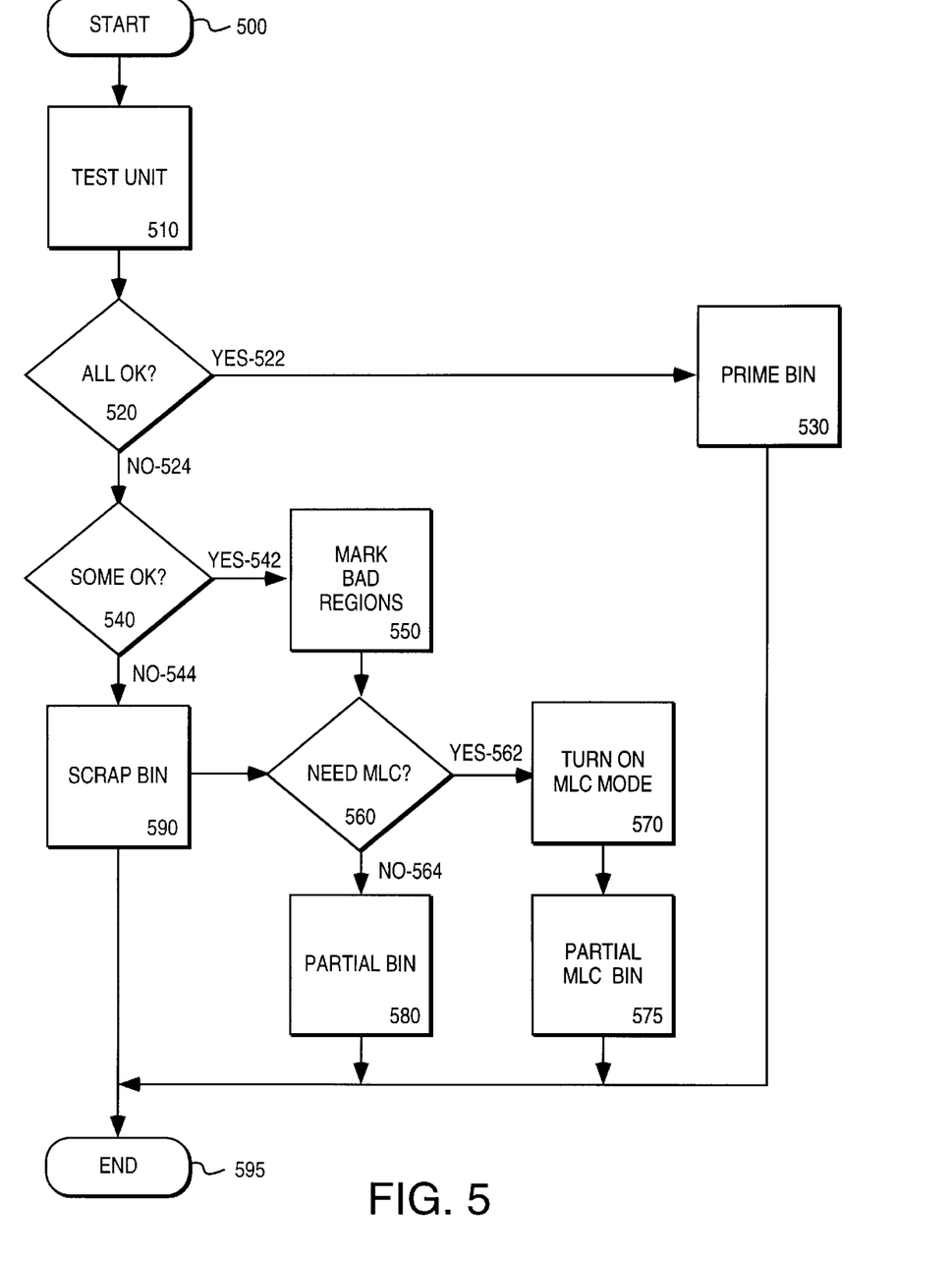
FIG. 5 is a flow chart of a testing process that can be used to detect partially functional dice.

There is a manufacturing process that will allow unrepairable defects to be used as partials. FIG. 5 is a flow chart of a possible testing process that can be used to detect partially functional dice. One tests to cull unsalvagable defective parts from fully and partially functional parts (decision blocks 520 and 540). For partially functional parts the test locates and marks the bad blocks (process block 550). Usually the standard test flow is that once the test determines that there are so many defects that the part cannot be fully functional, the test ends and the die is physically marked bad. To utilize partially functional dice, the entire part is tested to determine all unrepairable blocks and then the piece of the die memory that could not be salvaged is marked. Because flash memory is nonvolatile, one can use internal memory to store the bad blocks and thereby allow the system to determine which erased blocks are not functional. This hardware is used to mark the blocks bad. Furthermore, multi-level cell hardware and embedded multi-level programming software in the partially functional memory devices that need to have their density increased are used to provide the multi-level cell capability (process block 570).

In the prior art, a particular die was either good or bad. Therefore, previously one would test a die until it passed all of the tests or until one found the first defect that could not be repaired through redundancy. As soon as the first defect that could not be repaired was found, there was no need to continue testing the die because it was bad. Therefore the test would end and the defective die would be marked to be thrown away as scrap. For example, one would ink the bad die by putting an ink dot on it. Then, during the assembly stage when the wafer is cut up with a saw, the inked die would be discarded.

Because partially functional dice can be used, one continues the test after it has been discovered that a particular die is not fully functional. Thus, one tests the entire die and maintains a count as to the number and location of defects. For one embodiment, no dice would be inked. Alternately, only extremely bad dice that are so bad that have very little functionality, and are therefore are not salvageable, would be inked. In the case of flash memory dice, because they have a nonvolatile memory, one can test and then store the testing results in the die that was just tested. That die can then pass along the test results to each successive step of its production into a packaged integrated circuit.

Thus, one would test all of the individual blocks of a die. If one found some defective blocks, one could store the identities of the bad blocks in the first good block of the die. Then the rest of the testing would be performed to ensure that the good blocks are sound. One would imprint all of the test result information into the device itself and that information would be retained through the assembly and test process. Each individual die would be able to identify whether it is good or bad, and if it is bad, what parts are not functioning properly.

Alternately, one can keep a floppy disk along with the wafer and store on the floppy disk the information regarding which of the dice on the wafer are fully functional, which of the dice are partially functional and which are unsalvagable. Then, when the wafer reached the saw machine, a pick and place routine for the saw would read the floppy to find out the status of each individual die on the wafer. The saw would then cut the wafer up into individual dice and place each fully functional die into one bin, place each partially functional die into another bin and place the dead dice into the trash bin.

The benefits of defect isolation circuitry for partially functional dice also apply to wafer scale integration. Wafer scale integration of flash memory devices can be used, for example, to manufacture a flash memory system such as a solid state drive. Rather than separate each memory site in a wafer into an individual component, one can cut from a wafer one slab of silicon that has multiple memory sites on it. It is also possible to include a controller site within this multiple memory site slab. Thus, wafer scale integration permits one to make use of a large slab of silicon that has a lot of circuitry inside.

If one has a single silicon wafer with several separate dice, one or more of the dice may have defective regions. In fact, the more dice that one integrates into a single wafer, the more likely it becomes that one or more of the dice will have some defective regions. Therefore, as wafer scale integration is applied, the ability to use partially functional dice becomes increasingly important.

For example, suppose one desired to use ten 16 Megabit dice in a single wafer. Further suppose that yields were such that, on average, each of the 10 dice of a given wafer has a 1 Megabit defective region. In such a case, it would be highly unlikely that a wafer would be produced that had ten fully functional dice located together in one area. Therefore, very few of the ten dice clusters produced could be used.

A large number of usable dice clusters result, however, if one reduces the requirements so that partially functional dice can be used. Rather than using ten fully functional dice per cluster, the clusters can actually include 11 dice per wafer. One can then use the eleventh die to supplement the other dice within the wafer and thereby provide coverage for their bad regions. Thus, several defective units can be combined together to make one good multiple die module of a bigger scale. Note that, so long as enough of the extra die is functional to replace the unusable areas of the other dice, this benefit accrues even when the extra die is only partially functional. Also note that more than one extra die can be used if a single die cannot replace all of the defective regions of the other dice.

The use of partially functional dice in wafer scale integration can be extended out in many directions. The fundamental idea is that one uses as many good bits out of a chunk of silicon as can possibly be salvaged. Thus, once one abandons the Boolean concept of each die being either good or bad, one can use all available silicon. If certain spots within the silicon are bad, one can identify the bad regions. These bad regions can be mapped out thereby permitting one to make use of all of the functional areas. The good regions can be supplemented by enabling multi-level cell storage circuitry on the chip and disabling the two-level cell storage.

For one embodiment one can use the big multi-die cluster by bonding to each die individually. Alternately, however, one can extend the integration further. This is because within each cluster there is a big scribe line area in between what would have been the individual dice. If the wafer is not cut up, the scribe line area will not be used. In such a case, the scribe line area then can be used as a via duct to link the individual dice and thereby make the cluster into one big chip. Thus, because the wafer will not be cut up, interconnects can be added within the scribe line area to link together the dice within the cluster.

Figure 6:
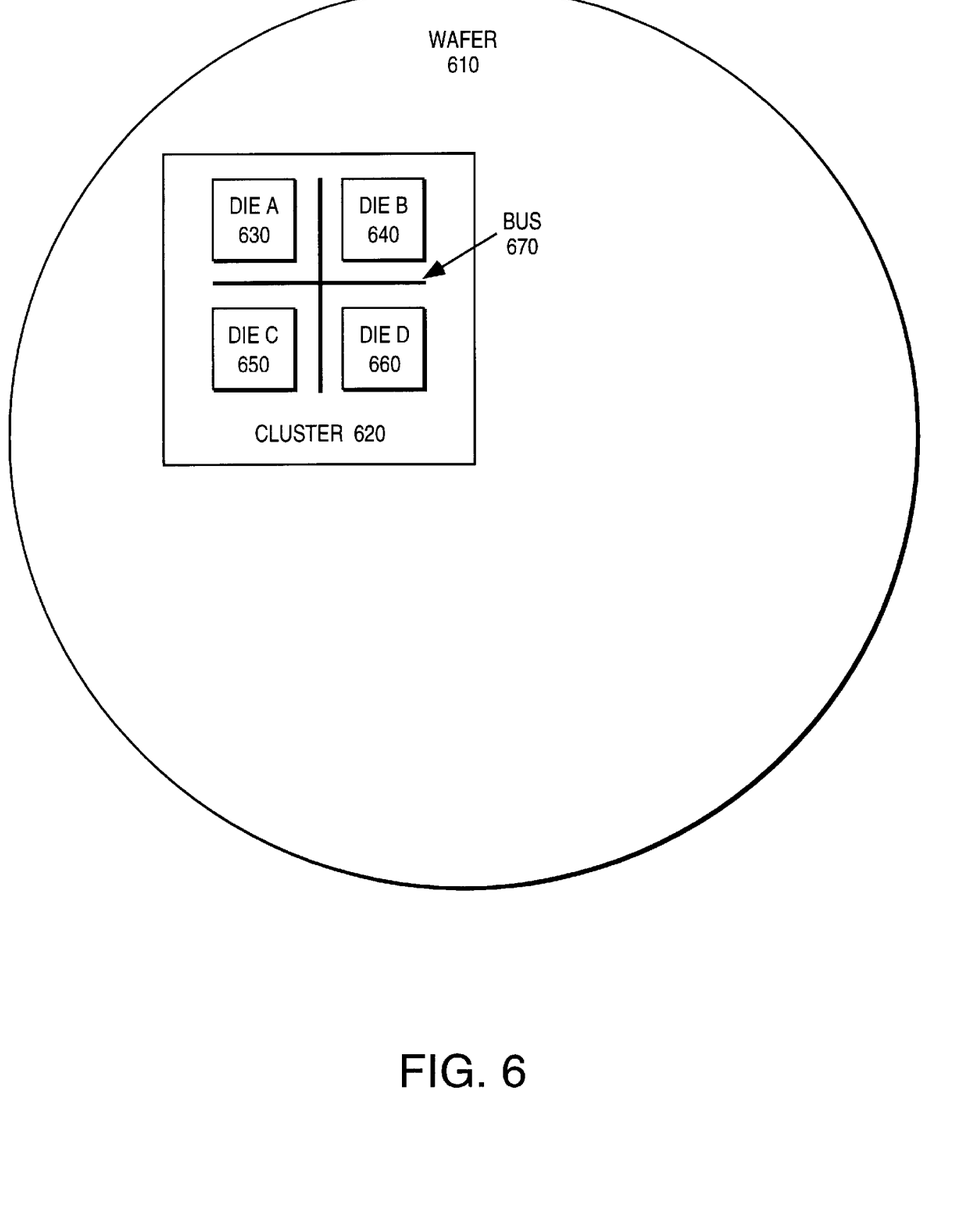
FIG. 6 illustrates the use of partially functional dice within a multiple die cluster of a wafer; and, FIG. 7 illustrates a die that can be combined into a multiple die cluster or bonded out as an individual component.

FIG. 6 illustrates the use of partially functional dice within a multiple die cluster of a wafer. In FIG. 6, multiple die cluster 620 is formed on wafer 610 from the four dice: die A 630, die B 640, die C 650 and die D 660. Bus 670 is disposed on wafer 610 within the scribe region used to separate the four dice of cluster 420 and is used to couple together the four dice of cluster 620.

For another alternate embodiment, one can further extend the wafer integration by including peripheral support components within the cluster. For example, rather than simply having a wafer composed of memory arrays, one can include a flash controller network on the wafer. Thus, for example, in FIG. 6, if dice A 630, B 640 and C 650 are flash memory arrays, instead of making die D 660 another flash memory array, it could be a flash controller for the other dice of cluster 620. In this way one can place a majority of the electronics of a system onto a single slab of silicon and interconnect the various dice.

Utilizing multiple die clusters permits one to decrease the packaging costs associated with packaging each die individually. Furthermore, a single package that contains the multiple die cluster is significantly smaller than would be the case if each die were packaged individually. Moreover, bandwidth and performance are improved. This is because all of the dice are located on a single substrate so signals need only travel relatively short distances instead of having to go in and out of packages. This is also because one no longer has the narrow bandwidth constraints imposed by having to provide separate pins for each die. Thus, a chip formed from a multiple die cluster will be fast, tiny and have virtually no bus constraints.

Figure 7:
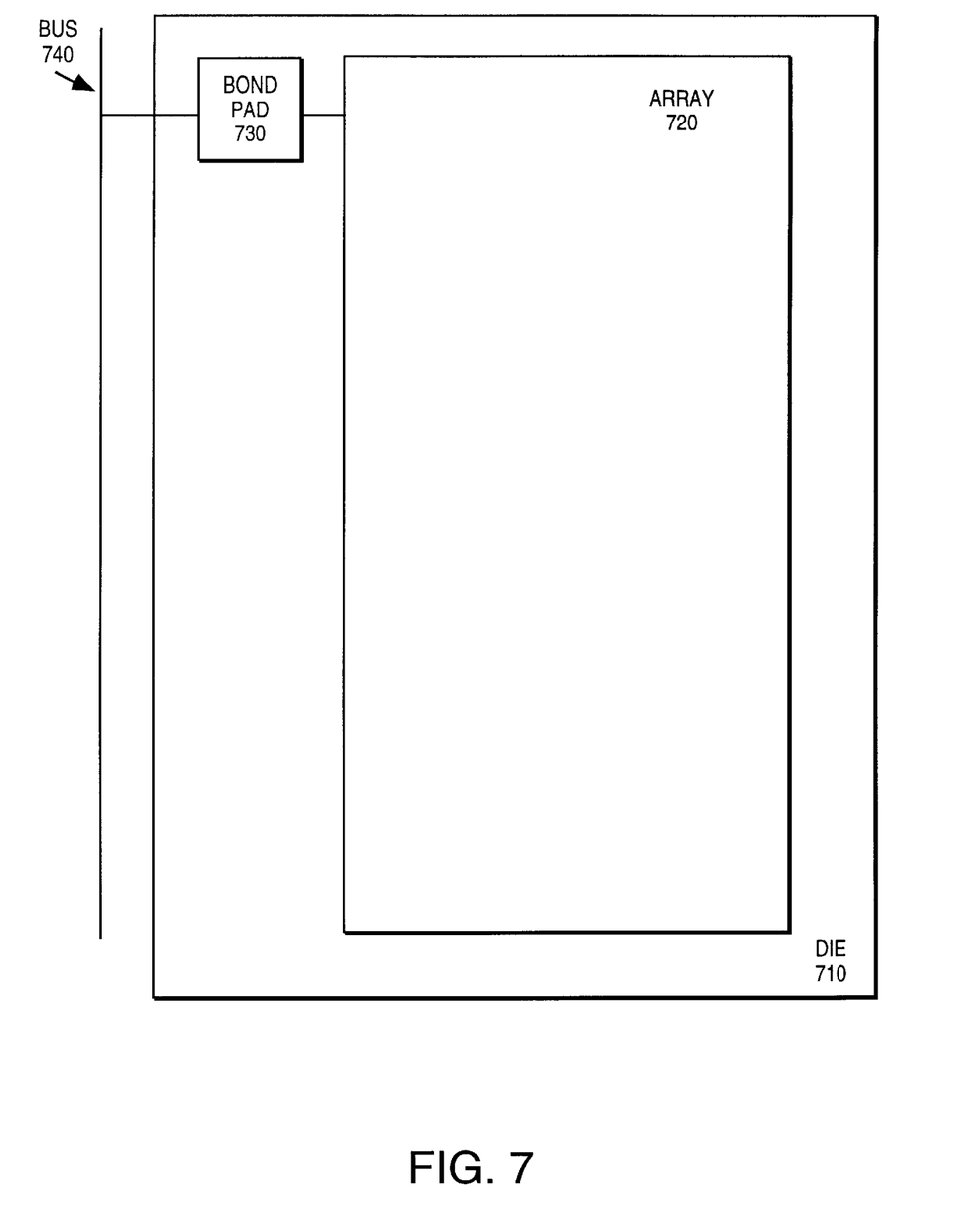

Adding peripheral support components onto the chip, however, increases the likelihood that a multiple die cluster cannot be used. For example, if a cluster only has one centralized controller and, if that controller is defective, then the entire cluster will not be usable. To solve this problem, for one embodiment, each memory die within the cluster is left with the capability to bond out and be used individually as a memory chip. Then, if the memory controller portion of a cluster is unusable, one can recover part of the wafer by cutting up the cluster along the scribe line area and using the good sections of the cluster as individual memory chips. FIG. 7 illustrates a die that can be combined into a multiple die cluster or bonded out as an individual component. Thus, in FIG. 7, array 720 of die 710 is coupled to bus 740 through bond pad 730. Therefore, array 710 can be used with other dice coupled to bus 740 in a multiple die cluster. Alternately, because bus 740 is disposed within a scribe area, die 710 can be used separately by cutting along the scribe area and then bonding out using bond pad 730. Although die 710 is shown in FIG. 7 with only one bond pad 710, in actual practice, die 710 would have several bond pads.

If one provides a multi-level cell capability, one can use the fast single bit cell mode for the fully functional die and sell it at a premium to whomever is willing to pay for that performance. Then the partially functional die can be down binned and the multi-level mode turned on. When compared to a single bit cell, the multi-level cell has degraded performance in certain areas (write performance, for example) but has a higher density. Thus, for example, a 75% functional partial can be used as a slower memory that has 1.5 times the capacity of the original single bit cell part. Therefore, even though one has dice that are only partially functional, the partially functional dice can be expanded out by however many bits per cell one can tweak out of them.

The current demand for various types of memory will determine whether partially functional dice are used for single or multiple bit per cell storage. If the demand is there, one can also use some of the fully functional dice to store multiple bits per cell. The multiple bit per cell storage capability makes the partials more attractive because, in addition to using partially functional dice that would normally be thrown away, one can increase the density of the dice that are used.

Thus, methods and circuitry for utilizing partially functional integrated circuit memory devices cells have been described that isolate individual defective erase blocks and that place discrete amounts of charge in a single nonvolatile memory cell. Control of the wordline voltage level during programming controls the amount of charge placed in the memory cell. This allows multiple states to be defined in terms of charge amount, wherein each state represents a pattern of data bits. Thus, the method and circuitry described permit the use of partially functional integrated memory circuits that store storage multiple bits of data in a single memory cell.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. An apparatus comprising:
    a memory array having a plurality of blocks of multi-level memory cells;
    isolation circuitry, wherein the isolation circuitry disables any block containing defects; and
    multi-level cell circuitry that switches at least one non-defective block to a multiple bit per cell storage mode, if at least one block is disabled.

2. The apparatus of claim 1 wherein each of the plurality of blocks has a separate power supply and the isolation circuitry disables the power supply of any defective block.

3. The apparatus of claim 1 wherein each of the plurality of blocks has a separate set of pitch limited cells and the isolation circuitry disables the pitch limited cells of any defective block.

4. The apparatus of claim 3 wherein the pitch limited cells are row drivers.

5. The apparatus of claim 1 wherein each of the plurality of blocks has a separate set of column selects and the isolation circuitry disables the set of column selects of any defective block.

6. The apparatus of claim 1 further comprising:
    redundant circuitry to be used in place of defective portions of the memory array, the isolation circuitry being used to isolate defective blocks by disabling only the blocks that contain defects and cannot be brought to full functionality by use of the redundant circuitry.

7. The apparatus as set forth in claim 1 wherein the multi-level cell circuitry switches each block between the multiple bit per cell storage mode and a single bit per cell storage mode on a block by block basis.

8. The apparatus as set forth in claim 1 wherein the multi-level cell circuitry collectively switches blocks between the multiple bit per cell storage mode and a single bit per cell storage mode.

9. The apparatus of claim 1 further comprising a block status register to indicate the defective blocks if there are any defective blocks.

10. The apparatus as set forth in claim 1 wherein the memory cells of the array are flash memory cells.

11. The apparatus of claim 10 wherein each of the plurality of blocks is an erase block.

12. The apparatus of claim 11 where each erase block has 512K memory cells.

13. A method of utilizing a partially functional integrated circuit memory, the method comprising the steps of:
    a) partitioning an array of memory cells within the integrated circuit memory into a plurality of blocks;
    b) isolating defective blocks of the array such that any block that contains defects is disabled; and
    c) switching at least one non-defective block to a multiple bit per cell storage mode, if at least one block is disabled.

14. The method of claim 13 wherein step b) further comprises the step of:
    disabling a power supply of any defective block, wherein each of the plurality of blocks has a separate power supply.

15. The method of claim 13 wherein step b) further comprises the step of:
    disabling pitch limited cells of any defective block, wherein each of the plurality of blocks has a separate set of pitch limited cells.

16. The method of claim 15 wherein the pitch limited cells that are disabled are row drivers.

17. The method of claim 13 wherein step b) other comprises the step of:
    disabling column selects of any defective blocks, wherein each of the plurality of blocks has a separate set of column selects.

18. The method of claim 13, wherein step b) further comprises the steps of:
    replacing defective portions of the memory array with redundant circuitry; and
    disabling a defective block only if the redundant circuitry cannot overcome a defect.

19. The method of claim 13 wherein the blocks are capable of being switched between a single bit per cell storage mode and the multiple bit per cell storage mode on a block by block basis.

20. The method of claim 13 wherein the non-defective blocks are collectively switched between a single bit per cell storage mode and the multiple bit per cell storage mode.

21. The method of claim 13 further comprising the step of:
    storing a block status indication for each defective block in a block status register of the memory array.

22. The method as set forth in claim 13 wherein the memory cells of the array are flash memory cells.

23. The method of claim 22 wherein each of the plurality of blocks is an erase block.

24. The method of claim 23 where each of the erase blocks has 512K memory cells.

25. An apparatus comprising:
   a memory array having a plurality of blocks of multi-level memory cells;
   isolation circuitry, wherein the isolation circuitry disables any defective block; and
   multi-level cell circuitry that switches at least one non-defective block to a multiple bit per cell storage mode, if at least one block is disabled; and
   a processor coupled to the memory array to access at least one block that is not disabled.

26. The apparatus of claim 25 wherein each of the plurality of blocks has a separate power supply and the isolation circuitry disables the power supply of any defective block.

27. The apparatus of claim 25 wherein each of the plurality of blocks has a separate set of pitch limited cells and the isolation circuitry disables the pitch limited cells of any defective block.

28. The apparatus of claim 27 wherein the pitch limited cells are row drivers.

29. The apparatus of claim 25 wherein each of the plurality of blocks has a separate set of column selects and the isolation circuitry disables the set of column selects of any defective block.

30. The apparatus of claim 25 further comprising:
   redundant circuitry to be used in place of defective portions of the memory array, the isolation circuitry being used to isolate defective blocks by disabling only the blocks that contain defects and cannot be brought to full functionality by use of the redundant circuitry.

31. The apparatus as set forth in claim 25 wherein the multi-level cell circuitry switches each block between the multiple bit per cell storage mode and a single bit per cell storage mode on a block by block basis.

32. The apparatus as set forth in claim 25 wherein the multi-level cell circuitry collectively switches blocks between the multiple bit per cell storage mode and a single bit per cell storage mode.

33. The apparatus of claim 25 further comprising a block status register to indicate the defective blocks if there are any defective blocks.

34. The apparatus as set forth in claim 25 wherein the memory cells of the array are flash memory cells.

35. The apparatus of claim 32 wherein each of the plurality of blocks is an erase block.

36. The apparatus of claim 35 wherein each erase block has 512K memory cells.

37. An apparatus comprising:
   a plurality of memory array dice disposed as a cluster on a wafer, at least one of the memory array dice comprising:
      a plurality of blocks of multi-level memory cells;
      isolation circuitry, wherein the isolation circuitry disables defective blocks;
      multi-level cell circuitry wherein the multi-level cell circuitry switches at least one non-defective block to a multiple bit per cell storage mode, if at least one block is disabled.

38. The apparatus of claim 37 wherein each of the plurality of blocks has a separate power supply and the isolation circuitry disables the power supply of any defective block.

39. The apparatus of claim 37 wherein each of the plurality of blocks has a separate set of pitch limited cells and the isolation circuitry disables the pitch limited cells of any defective block.

40. The apparatus of claim 39 wherein the pitch limited cells are row drivers.

41. The apparatus of claim 37 wherein each of the plurality of blocks has a separate set of column selects and the isolation circuitry disables the set of column selects of any defective block.

42. The apparatus of claim 37 further comprising:
   redundant circuitry to be used in place of defective portions of the at least one of the memory array dice, the isolation circuitry being used to isolate defective blocks by disabling only the blocks that contain defects and cannot be brought to full functionality by use of the redundant circuitry.

43. The apparatus as set forth in claim 37 wherein the multi-level cell circuitry switches each block between the multiple bit per cell storage mode and a single bit per cell storage mode on a block by block basis.

44. The apparatus as set forth in claim 37 wherein the multi-level cell circuitry collectively switches block between the multiple bit per cell storage mode and a single bit pet cell storage mode.

45. The apparatus of claim 37 further comprising a block status register to indicate the defective blocks if there are any defective blocks.

46. The apparatus as set forth in claim 37 wherein the memory cells of the at least one of the memory array dice are flash memory cells.

47. The apparatus of claim 46 wherein each of the plurality of blocks is an erase block.

48. The apparatus of claim 47 wherein each erase block has 512K memory cells.

49. The apparatus of claim 37 wherein the wafer has a scribe region separating the plurality of memory array dice and at least two of the memory array dice are coupled by a bus within the scribe region.

50. The apparatus of claim 49 wherein at least one of the memory array dice can be bonded out separately if the cluster is cut apart along the scribe region.

51. The apparatus of claim 49 further comprising a controller die disposed within the cluster of the wafer, the controller die coordinating access to the memory cells.

52. The apparatus of claim 51 wherein at least one of the memory array dice can be bonded out separately if the cluster is cut apart along the scribe region.

* * * * *